United States Patent
Bai (10) Patent No.: US 10,651,257 B2
(45) Date of Patent: May 12, 2020

(54) ARRAY SUBSTRATE AND MANUFACTURING METHOD THEREOF

(71) Applicant: Wuhan China Star Optoelectronics Semiconductor Display Technology Co., Ltd., Wuhan, Hubei (CN)

(72) Inventor: Sihang Bai, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 31 days.

(21) Appl. No.: 15/979,335

(22) Filed: May 14, 2018

(65) Prior Publication Data

US 2019/0189719 A1    Jun. 20, 2019

Related U.S. Application Data

(63) Continuation of application No. PCT/CN2018/072735, filed on Jan. 15, 2018.

(30) Foreign Application Priority Data

Dec. 18, 2017  (CN) .......................... 2017 1 1361236

(51) Int. Cl.
*H01L 27/32*    (2006.01)
*H01L 29/786*   (2006.01)
(Continued)

(52) U.S. Cl.
CPC ........ *H01L 27/3262* (2013.01); *H01L 27/124* (2013.01); *H01L 29/66765* (2013.01);
(Continued)

(58) Field of Classification Search
CPC ............... H01L 27/124; H01L 27/3262; H01L 29/66765
See application file for complete search history.

(56) References Cited

U.S. PATENT DOCUMENTS 5,470,769 A    11/1995  Kim
6,013,930 A *   1/2000  Yamazaki ........... H01L 27/1214
                                                              257/353
(Continued)

FOREIGN PATENT DOCUMENTS

CN    103489882 A    1/2014
CN    103943628 A    7/2014
(Continued)

*Primary Examiner* — Zandra V Smith
*Assistant Examiner* — John M Parker
(74) *Attorney, Agent, or Firm* — Hemisphere Law, PLLC; Zhigang Ma (57) ABSTRACT

The present disclosure provides a manufacturing method of an array substrate, including: forming a gate layer on a substrate; forming a gate insulating material layer on the gate layer; forming a polysilicon material layer on the gate insulating material layer; depositing an etch stop material layer on the polysilicon material layer; channel doping the polysilicon material layer; etching the polysilicon material layer, the etch stop material layer and the gate insulating material layer to form an active layer, an etch stop layer and a gate insulating layer; forming a source/drain layer on the active layer and the gate insulating layer, the active layer being electrically connected to the source/drain layer, and forming a through hole on the source/drain layer to form a source and a drain, the through hole being corresponding to the active layer, and both of the source and the drain being electrically connected to the active layer.

7 Claims, 6 Drawing Sheets (51) Int. Cl.
*H01L 51/56* (2006.01)
*H01L 29/66* (2006.01)
*H01L 51/00* (2006.01)
*H01L 27/12* (2006.01)
*H01L 51/52* (2006.01)

(52) U.S. Cl.
CPC .... *H01L 29/78678* (2013.01); *H01L 51/0097* (2013.01); *H01L 51/56* (2013.01); *H01L 51/5253* (2013.01); *H01L 2251/5338* (2013.01)

(56) References Cited

U.S. PATENT DOCUMENTS

| | | | | |
|---|---|---|---|---|
| 6,146,929 | A * | 11/2000 | Oana | H01L 27/1214 438/151 |
| 2001/0049163 | A1 * | 12/2001 | Yamazaki | H01L 27/1214 438/158 |
| 2003/0040150 | A1 * | 2/2003 | Yamazaki | H01L 27/1214 438/200 |
| 2006/0110862 | A1 * | 5/2006 | Gan | H01L 29/4908 438/149 |
| 2008/0303030 | A1 * | 12/2008 | Sakai | H01L 27/1214 257/72 |
| 2010/0032673 | A1 | 2/2010 | Saitou et al. | |
| 2010/0159619 | A1 * | 6/2010 | Umezu | H01L 21/02532 438/23 |
| 2013/0161630 | A1 * | 6/2013 | Nishida | H01L 29/66765 257/66 |
| 2014/0014952 | A1 * | 1/2014 | Katsui | H01L 29/41733 257/43 |
| 2015/0102337 | A1 * | 4/2015 | Lou | H01L 27/124 257/43 |
| 2019/0096670 | A1 * | 3/2019 | Li | H01L 21/28556 |

FOREIGN PATENT DOCUMENTS

| | | |
|---|---|---|
| CN | 104934439 A | 9/2015 |
| CN | 106876476 A | 6/2017 |
| CN | 107039284 A | 8/2017 |
| CN | 107591413 A | 1/2018 |

\* cited by examiner

ARRAY SUBSTRATE AND MANUFACTURING METHOD THEREOF

RELATED APPLICATIONS

This application is a continuation application of PCT Patent Application No. PCT/CN2018/072735, filed Jan. 15, 2018, which claims the priority benefit of Chinese Patent Application No. CN 201711361236.8, filed Dec. 18, 2017, which is herein incorporated by reference in its entirety.

FIELD OF THE DISCLOSURE

The present disclosure relates to a display technology field, and more particularly to an array substrate and a manufacturing method thereof.

BACKGROUND OF THE DISCLOSURE

At present, low-temperature polysilicon thin film transistors (LTPS TFTs) receive much attention for their high electron mobility and stability. Most of the traditional low-temperature polysilicon thin-film transistor using the top gate structure. However, the surface of the active layer deposited by deposition is not smooth, which may result in poor flatness of structures such as gates subsequently deposited on the active layer, the resistance distribution of the interface between the active layer and the gate is apt to be uneven, which leads to the instability of the overall performance.

SUMMARY OF THE DISCLOSURE

In order to solve the aforementioned problems, the present disclosure provides an array substrate and a manufacturing method thereof.

A manufacturing method of an array substrate includes the following steps:
forming a gate layer on a substrate;
forming a gate insulating material layer on the gate layer, wherein the gate insulating material layer covers the gate layer and the substrate;
forming a polysilicon material layer on the gate insulating material layer;
depositing an etch stop material layer on the polysilicon material layer;
channel doping the polysilicon material layer;
etching the polysilicon material layer, the etch stop material layer and the gate insulating material layer to form an active layer, an etch stop layer and a gate insulating layer, wherein the gate insulating layer covers the gate layer and the substrate, the active layer is formed on the gate layer, the etch stop layer covers the active layer;
forming a source/drain layer on the active layer and the gate insulating layer, the active layer being electrically connected to the source/drain layer; and
forming a through hole on the source/drain layer to further form a source and a drain, the through hole being corresponding to the active layer, and both of the source and the drain being electrically connected to the active layer.

Further, the gate layer includes a first gate and a second gate spaced apart from the first gate, the first gate is disposed corresponding to the active layer, and the second gate is electrically connected to the drain.

Further, the step of etching the polysilicon material layer, the etch stop material layer and the gate insulating material layer to form an active layer, an etch stop layer and a gate insulating layer, wherein the gate insulating layer covers the gate layer and the substrate, the active layer is formed on the gate layer, the etch stop layer covers the active layer further includes:
etching the gate insulating material layer such that a top surface of the second gate away from the substrate is exposed to enable the second gate to be in contact with the drain.

Further, the active layer includes a channel region, a first non-channel region and a second non-channel region, the channel region is connected between the first non-channel region and the second non-channel region, the channel region is disposed corresponding to the through hole, an end face of the active layer located at the first non-channel region and away from the channel region is electrically connected to the source, an end face of the active layer located at the second non-channel region and away from the channel region is electrically connected to the drain.

Further, the step of depositing an etch stop material layer on the polysilicon material layer further includes the following steps:
depositing a prefabricated etch stop material layer on the polysilicon material layer; etching the prefabricated etch stop material layer to form the etch stop material layer; wherein the etch stop material layer includes a first etch stop material layer and a second etch stop material layer connected to the first etch stop material layer, the first etch stop material layer is disposed corresponding to the active layer, and a thickness of the first etch stop material layer is greater than a thickness of the second etch stop material layer.

Further, the thickness of the first etch stop material layer is the same as the thickness of the prefabricated etch stop material layer.

Further, after the step of forming a through hole on the source/drain layer to further form a source and a drain, the through hole being corresponding to the active layer, and both of the source and the drain being electrically connected to the active layer, the manufacturing method further includes: forming an organic light-emitting layer on the source and the drain.

Further, the step of forming an organic light-emitting layer on the source and the drain specifically includes the following steps:
depositing a passivation layer on the source and the drain;
forming an anode on the passivation layer, the anode being connected to the drain;
forming a pixel defining layer on the passivation layer, the pixel defining layer covering the anode, the organic light-emitting layer including the passivation layer, the anode, and the pixel defining layer.

Further, the step of forming a gate layer on a substrate further includes the following steps:
forming a barrier layer on a base substrate;
forming a buffer layer on the barrier layer;
forming the gate layer on the buffer layer, wherein the base substrate, the barrier layer and the buffer layer are sequentially stacked to form the substrate.

An array substrate includes a substrate, a gate layer, a gate insulating layer, an active layer made of polysilicon material, an etch stop layer, a source and a drain, the gate layer is disposed on the substrate, the gate insulating layer covers the gate layer and the substrate, the active layer is disposed on the gate insulating layer, the etch stop layer covers the active layer, the source and the drain are disposed on the etch stop layer, and both of the source and the drain are electrically connected to the active layer.

In the array substrate provided by the present disclosure and the manufacturing method thereof, since the array substrate has a bottom gate structure, the phenomenon of uneven interface resistance caused by the uneven surface caused by the active layer made of the polysilicon material in the top gate structure in the prior art is reduced, improves the stability of the electrical properties of the overall structure. In addition, since the source and drain are not filled by the traditional hole digging, the filling of the source line and the drain line may be prevented, resulting in uneven filling and poor contact. The phenomenon that the filling is incomplete due to air bubbles can be avoided more effectively during the filling process and the contact between the source and the drain and the active layer is more favorable.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF PREFERRED EMBODIMENTS

The technical solutions in the embodiments of the present disclosure will be described clearly and completely hereinafter with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without paying any creative efforts shall fall within the protection scope of the present disclosure.

Figure 1:
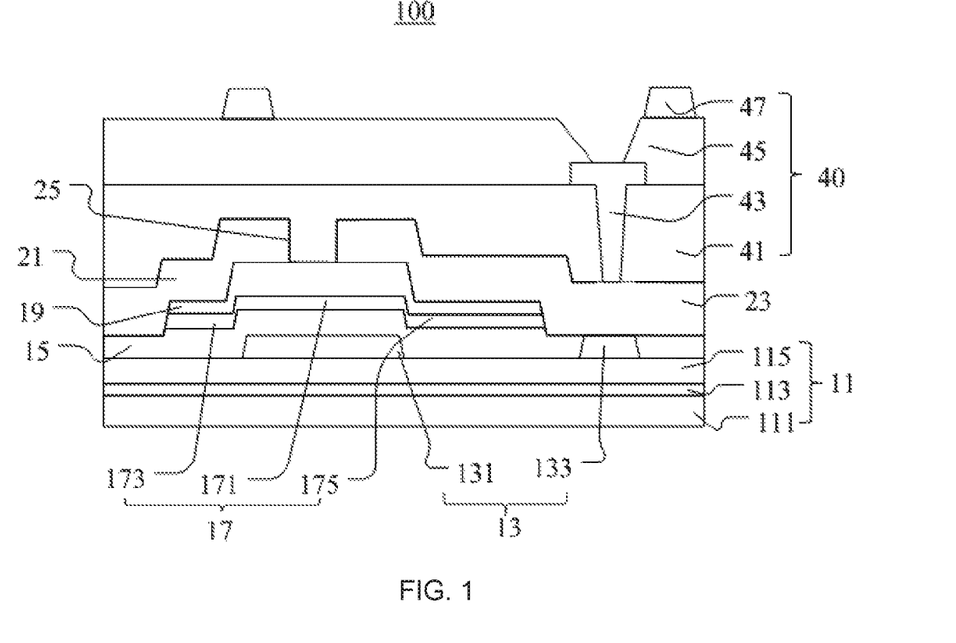
FIG. 1 is a schematic diagram of an array substrate according to an embodiment of the present disclosure.

Referring to FIG. 1, an embodiment of the present disclosure provides an array substrate 100. The array substrate 100 is applied to a display panel. The array substrate 100 includes a substrate 11, a gate layer 13, a gate insulating layer 15, an active layer 17 made of polysilicon material, an etch stop layer 19, a source 21 and a drain 23. The gate layer 13 is disposed on the substrate 11. The gate insulating layer 15 covers the gate layer 13 and the substrate 11. The active layer 17 is disposed on the gate insulating layer 15. The etch stop layer 19 covers the active layer 17. The source 21 and the drain 23 are disposed on the etch stop layer 19. The source 21 and the drain 23 are both electrically connected to the active layer 17.

In the present embodiment, the substrate 11 is a flexible substrate. The array substrate 100 is a flexible display panel.

The gate layer 13 is formed on the substrate 11. The gate layer 13 includes a first gate 131 and a second gate 133 spaced apart from the first gate 131. In the present embodiment, the first gate 131 and the second gate 133 are made of metal Mo, and the second gate 135 is disposed corresponding to the terminal region (PAD) of the array substrate 100. In other embodiments, the first gate 131 and the second gate 133 may be made of other metals, for example, a single-layer structure of a metal such as Al, Ti, Cu, Cr or the like, or an alloy of AlNd and MoNb. It is also possible to form a laminate of metals such as Al/Mo and Ti/Al/Ti. A top surface of the second gate 133 away from the substrate 11 is in contact with the The gate insulating layer 15 covers the gate layer 13. In the present embodiment, the thickness of the gate insulating layer 15 is about 2500 Å. It can be understood that the gate insulating layer 15 can be made of a single layer material such as $SiNx$, $SiO_2$ or the like, or it can be formed with a stacked layer of insulating materials such as $SiNx/SiO_2$ and $SiNx/Al_2O_3$.

The active layer 17 is formed on the gate insulating layer 17, the active layer 17 includes a channel region 171, a first non-channel region 173 and a second non-channel region 175. The channel region 171 is connected between the first non-channel region 173 and the second non-channel region 175. The channel region 171 is disposed corresponding to the first gate 131. In the present embodiment, the active layer 17 is formed by doping a polysilicon material through a channel. An end face of the active layer 17 located at the first non-channel region 173 and away from the channel region 171 is electrically connected to the source 21. An end face of the active layer 17 located at the second non-channel region 175 and away from the channel region 171 is electrically connected to the drain 23.

The etch stop layer 19 covers the channel region 171, the first non-channel region 173, and the second non-channel region 175. The etch stop layer 19 is used to prevent the etching liquid or etching gas from affecting the underlying active layer 17 during manufacturing of the array substrate 100.

In this embodiment, the source 21 and the drain 23 are formed by depositing a source-drain material layer (not shown) on the etch stop layer 19 and forming a through hole 25.

Further, the array substrate 100 further includes an organic light-emitting layer 40 further formed on the source 21 and the drain 23. The organic light-emitting layer 40 includes a passivation layer 41, an anode 43, a pixel defining layer 45, and a spacer 47. The passivation layer 41 covers the source 21 and the drain 23. The anode 43 is formed on the passivation layer 41 and connected to the drain 23. The pixel defining layer 43 is formed on the passivation layer 41. The spacer 47 is formed on the pixel defining layer 43.

Further, the substrate 11 includes a base substrate 111, a barrier layer 113 and a buffer layer 115. The barrier layer 113 is formed on the base substrate 111, and the buffer layer 115 is formed on the barrier layer 113. The base substrate 111, the barrier layer 113 and the buffer layer 115 are sequentially stacked to form the substrate 11. The base substrate 111 is made of a material such as polyimide (PI) and/or polyethylene terephthalate (PET). It is understood that the base substrate 111 may also be made of a hard material, such as glass.

Figure 2:
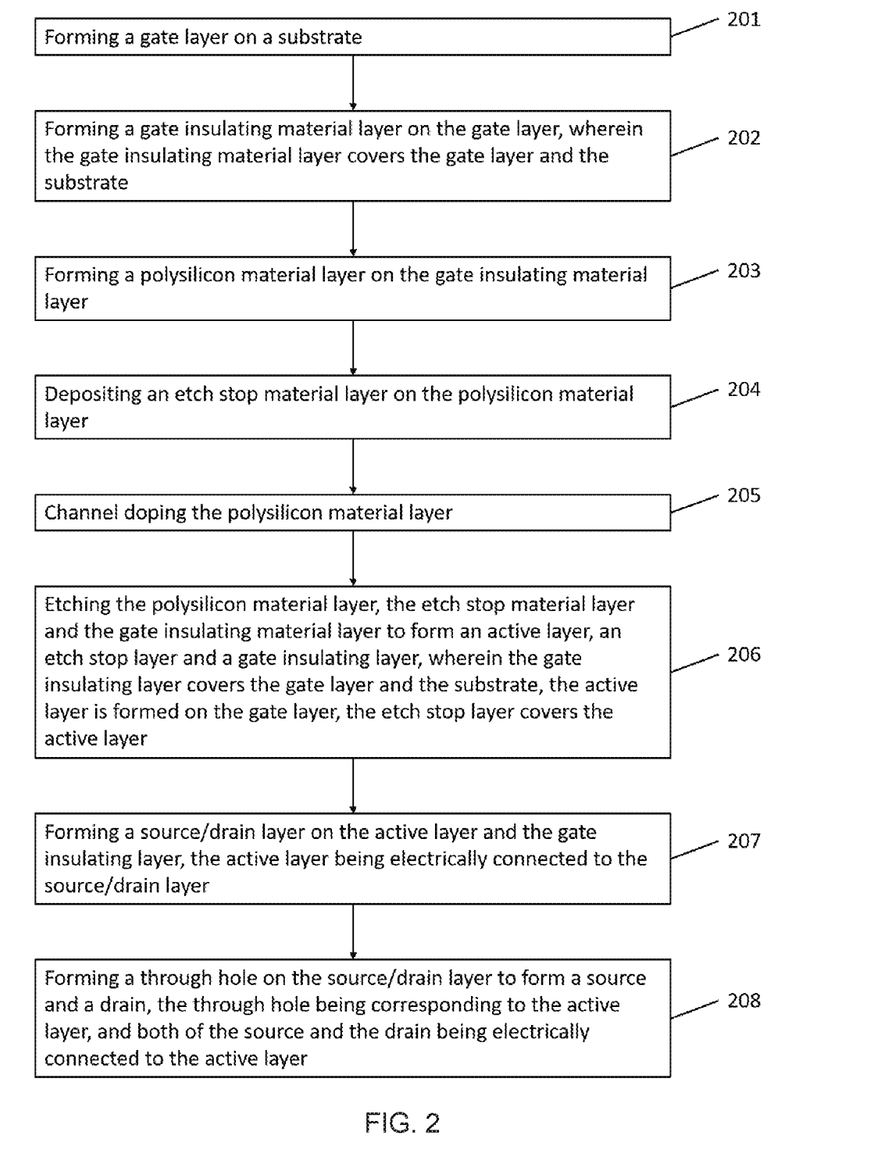
FIG. 2 is a flow chart of a manufacturing method of an array substrate according to an embodiment of the present disclosure.

Referring to FIG. 2, the present disclosure also provides a manufacturing method of an array substrate, including the following steps.

Figure 3:
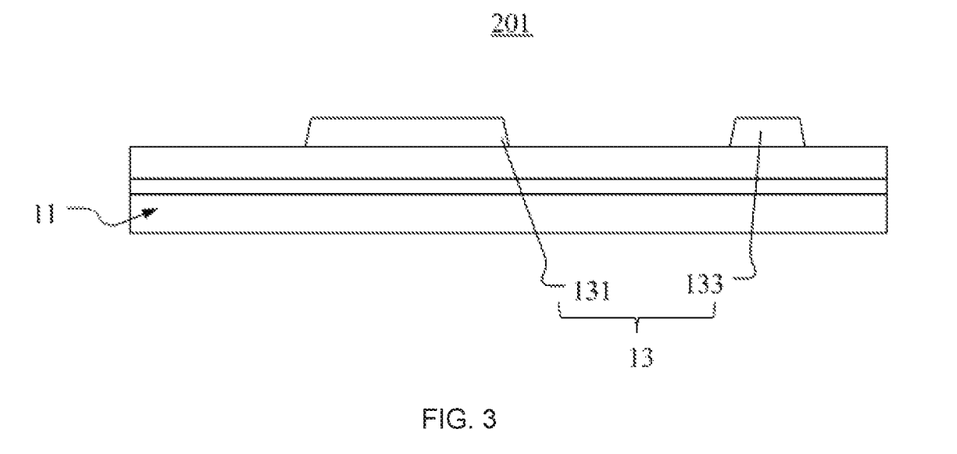
FIG. 3 is a schematic diagram of a first primary structure.

Step 201. Referring to FIG. 3, forming a gate layer 13 on a substrate 11. The structure formed in Step 201 is the first primary structure 201.

In the present embodiment, the gate layer 13 with the predetermined pattern is formed on the substrate 11 through a mask (not shown).

Figure 4:
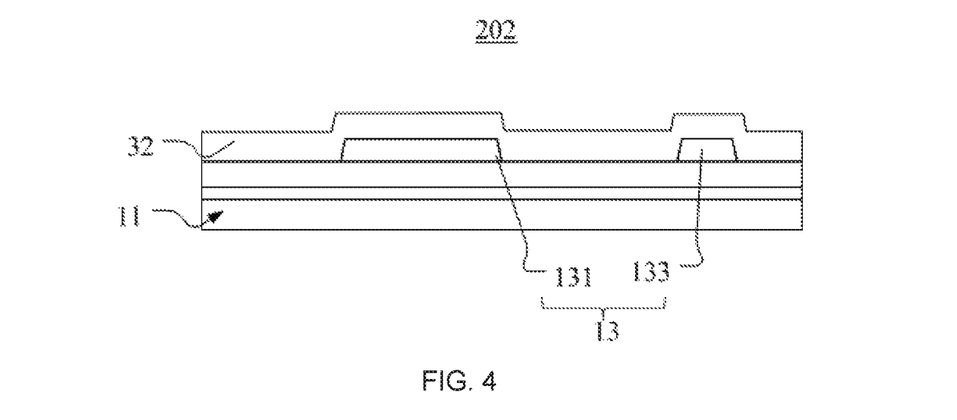
FIG. 4 is a schematic diagram of a second primary structure.

Step 202. Referring to FIG. 4, forming a gate insulating material layer 32 on the gate layer 13. The gate insulating material layer 32 covers the gate layer 13 and the substrate 11. The structure formed in Step 202 is the second primary structure 202.

Figure 5:
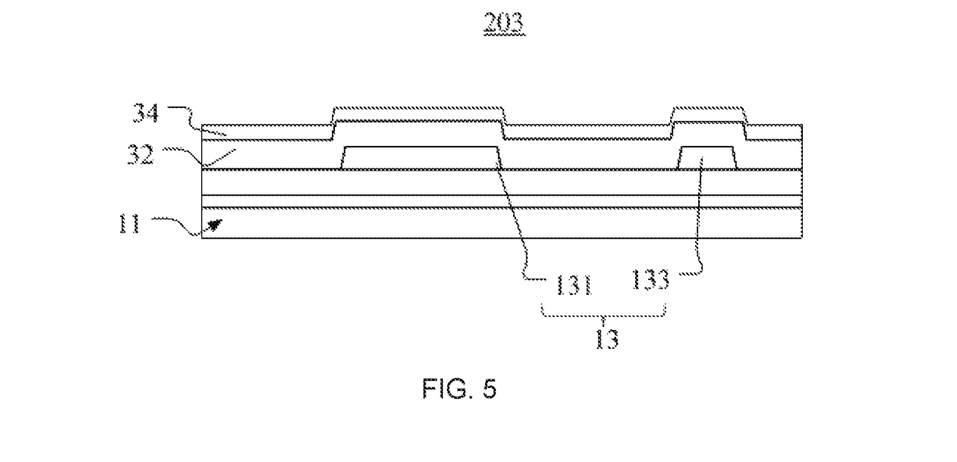
FIG. 5 is a schematic diagram of a third primary structure.

Step 203. Referring to FIG. 5, forming a polysilicon material layer 34 on the gate insulating material layer 32. The structure formed in Step 203 is the third primary structure 203.

Figure 6:
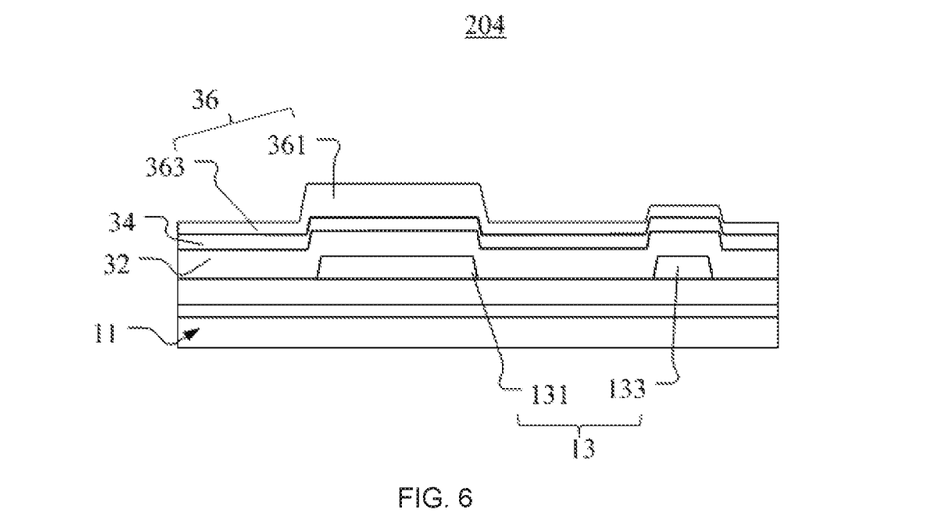
FIG. 6 is a schematic diagram of a fourth primary structure.

Step 204. Referring to FIG. 6, depositing an etch stop material layer 36 on the polysilicon material layer 34. The structure formed in Step 204 is the fourth primary structure 204.

Step 205. Channel doping the polysilicon material layer 34. The structure formed in Step 205 is the fifth primary structure (not shown).

Figure 7:
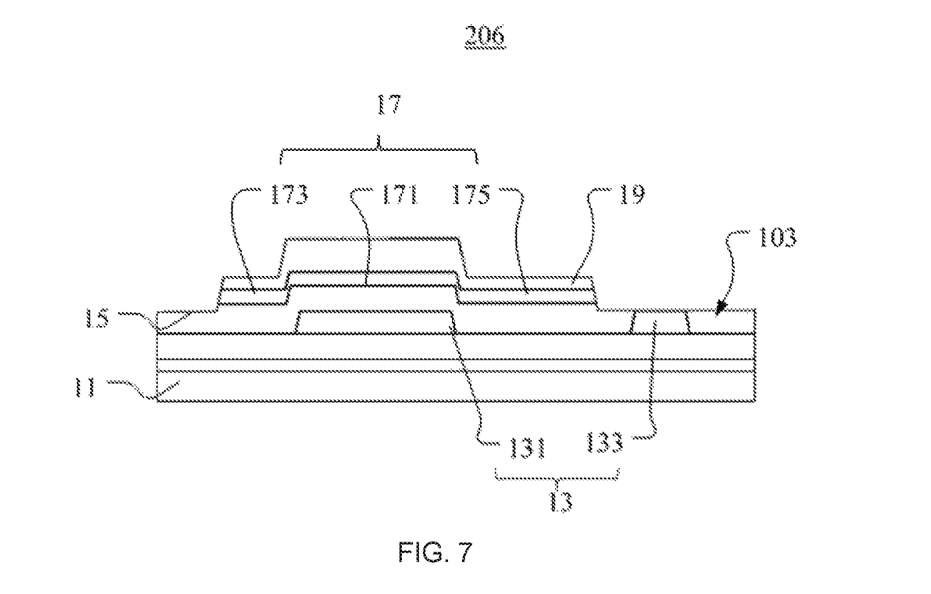
FIG. 7 is a schematic diagram of a sixth primary structure.

Step 206. Referring to FIG. 7, etching the polysilicon material layer 34, the etch stop material layer 36 and the gate insulating material layer 32 to form the active layer 17, the etch stop layer 19 and the gate insulating layer 15. The gate insulating layer 15 covers the gate layer 13 and the substrate 11. The active layer 17 is formed on the gate layer 13. The etch stop layer 19 covers the active layer 17. The structure formed in Step 206 is the sixth primary structure 206.

Figure 8:
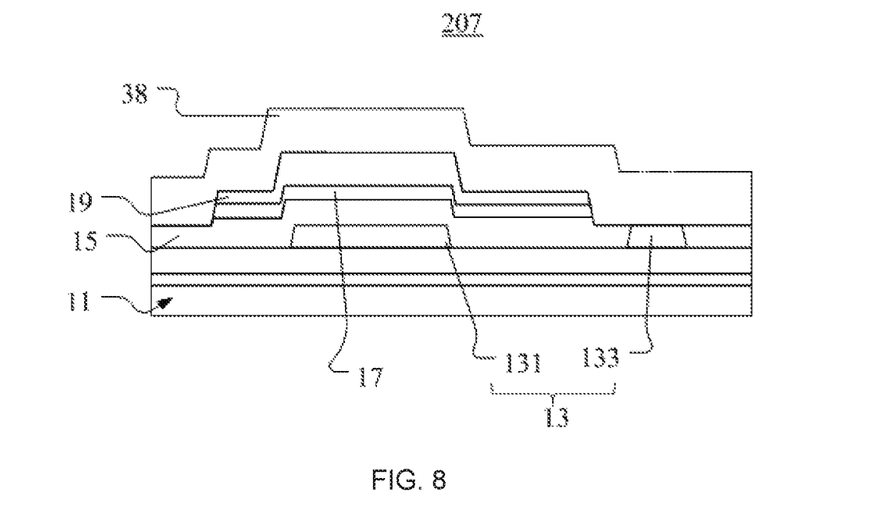
FIG. 8 is a schematic diagram of a seventh primary structure.

Step 207. Referring to FIG. 8, a source/drain layer 38 is formed on the active layer 17 and the gate insulating layer 15. The active layer 17 is electrically connected to the source/drain layer 20. The structure formed in Step 207 is the seventh primary structure 207.

Figure 9:
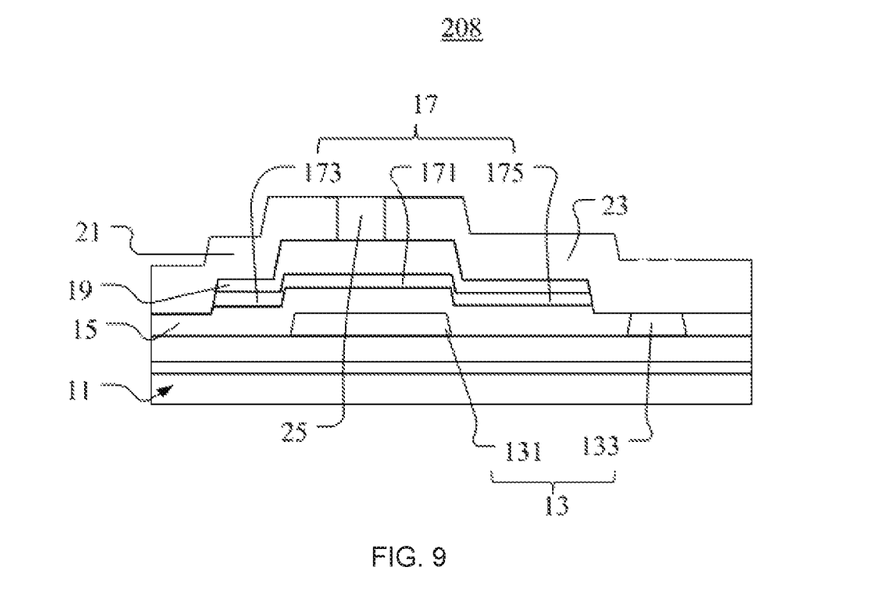
FIG. 9 is a schematic diagram of an eighth primary structure.

Step 208. Referring to FIG. 9, forming a through hole 25 on the source/drain layer 38 to form a source 21 and a drain 23. The through hole 25 is disposed corresponding to the active layer 17. Each of the source 21 and the drain 23 is electrically connected to the active layer 17. The structure formed in Step 208 is the eighth primary structure 208.

Further, the gate layer 13 includes a first gate 131 and a second gate 133 spaced apart from the first gate 131. The first gate 131 is disposed corresponding to the active layer 17. The second gate 135 is disposed corresponding to a terminal region (not shown) of the array substrate 100.

In step 206, the step of etching the polysilicon material layer 34, etch stop material layer 36 and the gate insulating material layer 32 to form the active layer 17, the etch stop layer 19 covering the active layer 17, and the gate insulating layer 15 specifically includes the following steps: etching the gate insulating material layer 32 such that a top surface of the second gate 133 away from the substrate 11 is exposed so that the second gate 133 can contact with the drain 23.

Further, the active layer 17 includes a channel region 171, a first non-channel region 173, and a second non-channel region 175. The channel region 171 is connected between the first non-channel region 173 and the second non-channel region 175. The channel region 171 is disposed corresponding to the position of the first gate 131. The second gate 133 is disposed adjacent to the second non-channel region 175. The through hole 25 is provided corresponding to the channel region 171.

In step 206, due to the provision of the etch stop layer 19, the region where the first gate 131 and the second gate 133 are provided is avoided during etching, so as to avoid the influence of etching liquid or etching gas on the gate layer 13. In addition, the polysilicon material layer 16, the etch stop layer 19 and the gate insulating layer 15 located in the non-active layer region 103 are etched and removed by surface-etching, until a top surface of the second gate 133 away from the substrate 11 is exposed.

In step 208, the through hole 25 is formed by etching the source/drain layer 20 with a photo mask, and further the source 21 and the drain 23 are formed. The drain 23 is in contact with the second gate 133. An end face of the active layer 17 located at the first non-channel region 173 and away from the channel region 171 is electrically connected to the source 21, an end face of the active layer 17 located at the second non-channel region 175 and away from the channel region 171 is electrically connected to the drain 23.

Further, in step 204, the step of depositing the etch stop material layer 36 on the polysilicon material layer 34 specifically includes the following steps.

Figure 10:
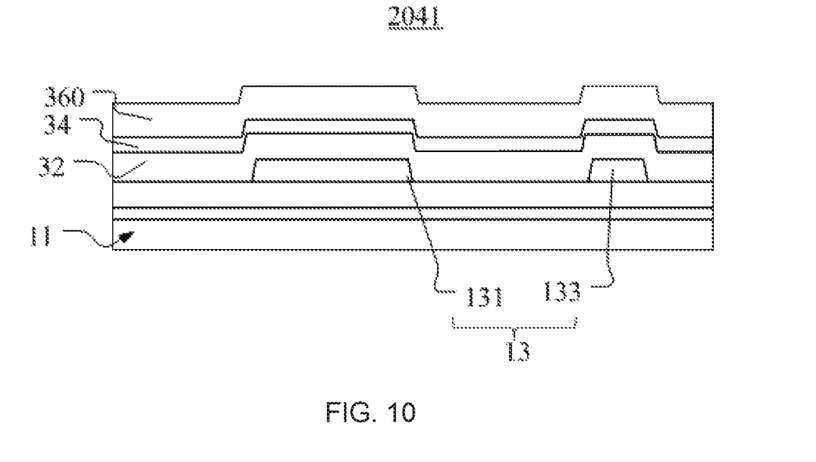
FIG. 10 is a schematic diagram of a fourth sub-primary structure.

Step 2041. Referring to FIG. 10, depositing a layer of prefabricated etch stop material 360 on the polysilicon material layer 34. The structure formed in step 2041 is the fourth sub-primary structure 2041.

Step 2042. Referring to FIG. 6 again, etching the prefabricated etch stop material layer 360 to form an etch stop material layer 36, the etch stop material layer 36 includes a first etch stop material layer 361 and a second etch stop material layer 363 connected to the first etch stop material layer 361. The first etch stop material layer 361 is disposed corresponding to the active layer 17, the first etch stop material layer 361 is disposed corresponding to the first gate 131, the thickness of the first etch stop material layer 361 is greater than the thickness of the second etch stop material layer 363.

In the present embodiment, the thickness of the prefabricated etch stop material layer 360 formed in step 2041 is about 3000 Å. In step 2042, the thickness of the first etch stop material layer 361 is the same as the thickness of the prefabricated etch stop material layer 360 formed in step 2041. In other words, the thickness of the first etch stop material layer 361 retains the original thickness of the prefabricated etch stop material layer 360, the thickness of the second etch stop layer 363 is about 500 Å, which avoids the influence of the subsequent etching process on the underlying material and further affects the performance of the array substrate 100.

In step 2042, the etch stop material layer 36 is etched through a mask to form a first etch stop material layer 361 and a second etch stop material layer 363 connected to the first etch stop material layer 361.

Because the conventional method of filling the holes with the source and the drain is not adopted, the phenomenon of uneven filling and poor contact may be avoided when filling the source line and the drain line. It is more favorable for the contact between the source 21 and the drain 23 and the active layer 17.

Further, referring to FIG. 1 again. After the step 208, the manufacturing method further includes step 209: forming an organic light-emitting layer 40 on the source 21 and the drain 23, the organic light-emitting layer 40 includes a passivation layer 41, an anode 43, and a pixel defining layer 45.

In step 209, the step of forming the organic light-emitting layer 40 on the source 21 and the drain 23 specifically includes the following steps.

Step 2091. Depositing a passivation layer 41 on the source 21 and the drain 23.

Further, in step 2091, forming a passivation layer 41 on the source 21 and the drain 23 through a mask, and forming a through hole 411 on the passivation layer 41.

Step 2092. Forming an anode 45 on the passivation layer 41, and connecting the anode 43 to the drain 23.

Further, in step 2092, forming an anode 45 on the passivation layer 41 through a mask, and connecting the anode 45 to the drain 23 through the through hole 411.

Step 2093. Forming a pixel defining layer 45 on the passivation layer 41, wherein the pixel defining layer 45 covers the anode 43.

Further, in step 2093. Forming a spacer 47 on the pixel defining layer 45. The spacer 47 serves to support the cell thickness. A pixel defining layer 45 and a spacer 47 are formed on the passivation layer 41 through a mask.

Further, in step 201, the step of forming the gate layer 13 on the substrate 11 specifically includes the following steps.

Step 2011. Forming a barrier layer 113 on the substrate 111.

Step 2012. Forming a buffer layer 115 on the barrier layer 113.

Step 2013. Forming the gate layer 13 on the buffer layer 115. The substrate 111, the barrier layer 113, and the buffer layer 115 are sequentially stacked to form the substrate 11.

In step 2013. Forming the gate layer 13 on the buffer layer 115 through a mask.

In the array substrate 100 and the manufacturing method thereof provided by the present disclosure, since the array substrate 100 has a bottom gate structure, the phenomenon of uneven interface resistance caused by surface irregularities caused by grain boundaries in the polysilicon in the top gate structure in the prior art is reduced, and improves the stability of the electrical properties of the thin film transistor. In addition, since the source and drain are not filled by the traditional hole digging, the filling of the source line and the drain line may be prevented, resulting in uneven filling and poor contact. The phenomenon that the filling is incomplete due to air bubbles during the filling process can be avoided, and the contact between the source 21, the drain 23 and the active layer 17 is more favorable.

It can be understood that the above disclosure is only the preferred embodiments of the present disclosure and certainly can not be used to limit the scope of the present disclosure. People of ordinary skill in the art may understand that all or part of the procedures for implementing the foregoing embodiments and equivalent changes made according to the claims of the present disclosure still fall within the scope of the present disclosure.

What is claimed is:

1. A manufacturing method of an array substrate, comprising:
    forming a gate layer on a substrate;
    forming a gate insulating material layer on the gate layer, wherein the gate insulating material layer covers the gate layer and the substrate;
    forming a polysilicon material layer on the gate insulating material layer;
    depositing an etch stop material layer on the polysilicon material layer;
    channel doping the polysilicon material layer;
    etching the polysilicon material layer, the etch stop material layer and the gate insulating material layer to form an active layer, an etch stop layer and a gate insulating layer, wherein the gate insulating layer covers the gate layer and the substrate, the active layer is formed on the gate layer, the etch stop layer covers the active layer;
    forming a source/drain layer on the active layer and the gate insulating layer, the active layer being electrically connected to the source/drain layer; and
    forming a through hole on the source/drain layer to further form a source and a drain, the through hole being corresponding to the active layer, and both of the source and the drain being electrically connected to the active layer;
    wherein the step of depositing an etch stop material layer on the polysilicon material layer further comprises the following steps:
    depositing a prefabricated etch stop material layer on the polysilicon material layer;
    etching the prefabricated etch stop material layer to form the etch stop material layer; wherein the etch stop material layer comprises a first etch stop material layer and a second etch stop material layer connected to the first etch stop material layer, the first etch stop material layer is disposed corresponding to the active layer, and a thickness of the first etch stop material layer is greater than a thickness of the second etch stop material layer.

2. The manufacturing method according to claim 1, wherein the gate layer comprises a first gate and a second gate spaced apart from the first gate, the first gate is located directly under the active layer, and the second gate is electrically connected to the drain.

3. The manufacturing method according to claim 2, wherein the step of etching the polysilicon material layer, the etch stop material layer and the gate insulating material layer to form an active layer, an etch stop layer and a gate insulating layer, wherein the gate insulating layer covers the gate layer and the substrate, the active layer is formed on the gate layer, the etch stop layer covers the active layer further comprises:
    etching the gate insulating material layer such that a top surface of the second gate away from the substrate is exposed to enable the second gate to be in contact with the drain.

4. The manufacturing method according to claim 1, wherein the thickness of the first etch stop material layer is the same as the thickness of the prefabricated etch stop material layer.

5. The manufacturing method according to claim 1, wherein after the step of forming a through hole on the source/drain layer to further form a source and a drain, the through hole being corresponding to the active layer, and both of the source and the drain being electrically connected to the active layer, the manufacturing method further comprises forming an organic light-emitting layer on the source and the drain.

6. The manufacturing method according to claim 5, wherein the step of forming an organic light-emitting layer on the source and the drain specifically comprises the following steps:
    depositing a passivation layer on the source and the drain;
    forming an anode on the passivation layer, the anode being connected to the drain;
    forming a pixel defining layer on the passivation layer, the pixel defining layer covering the anode, the organic light-emitting layer comprising the passivation layer, the anode, and the pixel defining layer.

7. The manufacturing method according to claim 1, wherein the step of forming a gate layer on a substrate further comprises the following steps:
   forming a barrier layer on a base substrate;
   forming a buffer layer on the barrier layer;
   forming the gate layer on the buffer layer, wherein the base substrate, the barrier layer and the buffer layer are sequentially stacked to form the substrate.

\* \* \* \* \*